United States Patent
Lee et al.

(10) Patent No.: US 6,603,196 B2
(45) Date of Patent: Aug. 5, 2003

(54) LEADFRAME-BASED SEMICONDUCTOR PACKAGE FOR MULTI-MEDIA CARD

(75) Inventors: Ming-Hsun Lee, Taichung (TW); Ho-Yi Tsai, Chiayi (TW)

(73) Assignee: Siliconware Precision Industries Co., Ltd., Taiwan (CN)

(*) Notice: Subject to any disclaimer, the term of this patent is extended or adjusted under 35 U.S.C. 154(b) by 3 days.

(21) Appl. No.: 09/820,135

(22) Filed: Mar. 28, 2001

(65) Prior Publication Data

US 2002/0140068 A1 Oct. 3, 2002

(51) Int. Cl.[7] .............................................. H01L 23/495
(52) U.S. Cl. ...................... 257/676; 257/666; 257/670; 257/723; 257/787
(58) Field of Search ................................ 257/666, 676, 257/787

(56) References Cited

U.S. PATENT DOCUMENTS

| | | | | |
|---|---|---|---|---|
| 5,428,248 A | * | 6/1995 | Cha | 257/676 |
| 5,633,528 A | * | 5/1997 | Abbott et al. | 257/666 |
| 5,770,888 A | * | 6/1998 | Song et al. | 257/696 |
| 6,040,622 A | | 3/2000 | Wallace | 257/679 |
| 6,084,310 A | * | 7/2000 | Mizuno et al. | 257/779 |
| 6,427,976 B1 | * | 8/2002 | Huang et al. | 253/676 |
| 6,525,405 B1 | * | 2/2003 | Chun et al. | 257/666 |

* cited by examiner

Primary Examiner—Steven Loke
Assistant Examiner—Nitin Parekh
(74) Attorney, Agent, or Firm—Peter F. Corless; Steven M. Jensen; Edwards & Angell, LLP

(57) ABSTRACT

A leadframe-based semiconductor package is proposed for the packaging of a semiconductor device, such as a multi-media card (MMC) chipset. The proposed semiconductor package is characterized by the use of a leadframe, rather than BT substrate or film, as the chip carrier for MMC chipset. The leadframe includes a supporting bar, a chip-supporting structure arranged at a downset position in relation to the supporting bar; and a plurality of leads, each lead including an outer-lead portion and an inner-lead portion; wherein the outer-lead portion is levelly linked to the supporting bar, while the inner-lead portion is arranged beside the chip-supporting structure and linked to the outer-lead portion via an intermediate-lead portion. The leadframe can be either the type having die pad or the type having no die pad. In the case of the type having die pad, a semiconductor chip is mounted on the die pad; and in the case of the type having no die pad, one or more semiconductor chips are mounted over an elongated part of the inner-lead portions of the leads. The use of leadframe allows the MMC package to be manufactured without having to include a lidding process, so that the MMC manufacture can be carried out in a less complex and more cost-effective manner.

10 Claims, 3 Drawing Sheets

LEADFRAME-BASED SEMICONDUCTOR PACKAGE FOR MULTI-MEDIA CARD

BACKGROUND OF THE INVENTION

1. Field of the Invention

This invention relates to semiconductor packaging technology, and more particularly, to a leadframe-based semiconductor package which is designed for the packaging of one or more semiconductor chips, such as a multi-media card (MMC) chipset, on a leadframe rather than BT substrate or film.

2. Description of Related Art

A multi-media card (MMC) is a semiconductor package that contains one or more semiconductor chips, including a controller chip and a memory chip, such as an EEPROM (Electrically-Erasable Programmable Read-Only Memory) chip. The MMC is widely utilized in multimedia applications for storing and processing digitized sound and video data.

Conventionally, MMC package is constructed by using BT substrate or film as the chip carrier. Related patents, include, for example, the U.S. Pat. No. 6,040,622 entitled "SEMICONDUCTOR PACKAGE USING TERMINAL FORMED ON A CONDUCTIVE LAYER OF A CIRCUIT BOARD", This patent discloses a semiconductor package which utilizes a substrate as chip carrier for mounting an EEPROM chipset including a controller chip and a memory chip.

One drawback to the use of BT substrate or film for MMC package, however, is that it requires a lidding process, which would make the overall packaging process quite complex and costly to implement.

There exists therefore a need in the semiconductor industry for a new semiconductor packaging technology that can be used to fabricate MMC packages in a less complex and more cost-effective manner.

SUMMARY OF THE INVENTION

It is therefore an objective of this invention to provide a new semiconductor packaging technology, which utilizes leadframe rather than BT substrate or film for the construction of MMC package.

It is another objective of this invention to provide a new semiconductor packaging technology, which can be used to fabricate MMC packages in a more cost-effective manner.

It is still another objective of this invention to provide a new semiconductor packaging technology, which can fabricate MMC packages through less complex process steps.

In accordance with the foregoing and other objectives, the invention proposes a new semiconductor packaging technology.

The semiconductor package of the invention is characterized by the use of a leadframe, rather than BT substrate or film, as the chip carrier for the construction of a semiconductor package, such as MMC package.

The leadframe utilized by the invention includes a supporting bar; a chip-supporting structure, which is arranged at a downset position in relation to the supporting bar; and a plurality of leads, each lead including an outer-lead portion and an inner-lead portion; wherein the outer-lead portion is levelly linked to the, supporting bar, while the inner-lead portion is arranged beside the chip-supporting structure and linked to the outer-lead portion via an intermediate-lead portion.

The leadframe can be either the type having die pad or the type having no die pad. In the case of the type having die pad, a semiconductor chip is mounted on the die pad; and in the case of the type having no die pad, one or more semiconductor chips-are mounted over an elongated part of the inner-lead portions of the leads.

The use of leadframe allows the MMC package to be manufactured without having to include a lidding process, so that the MMC manufacture can be carried out in a less complex and more cost-effective manner.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The leadframe-based semiconductor package according to the invention is disclosed in full details by way of three preferred embodiments in the following with reference to FIGS. 1A–1D, FIGS. 2A–2D, and FIGS. 3A–3D, respectively.

First Preferred Embodiment (FIGS. 1A–1D)

The first preferred embodiment of the semiconductor package according to the invention is disclosed in full details in the following with reference to FIGS. 1A–1D.

Figure 1A:
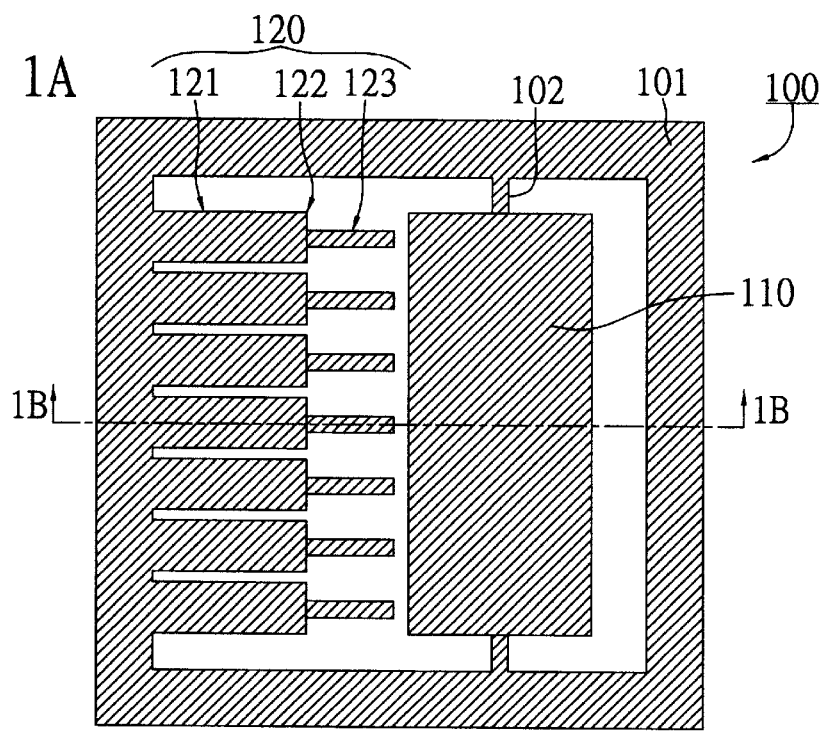
FIGS. 1A–1D are schematic diagrams used to depict a first preferred embodiment of the leadframe-based package according to the invention for MMC application.
Figure 1B:
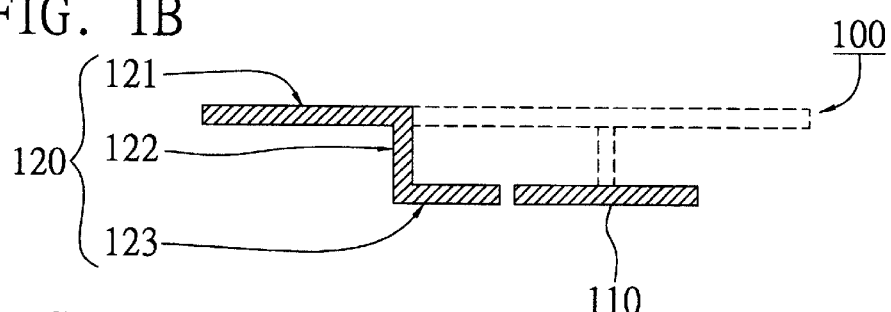

FIG. 1A is a schematic diagram showing the top view of a leadframe 100 utilized by the invention for constructing an MMC package; and FIG. 1B shows a sectional view of the leadframe 100 of FIG. 1A cutting through the line $1B-B_1$.

As shown, the leadframe 100 includes: (a) a supporting bar 101; (b) a die pad 110 arranged at a downset position in relation to the supporting bar 101 and linked via a plurality of tie bars 102 to the supporting bar 101, (c) a plurality of leads 120, each including an outer-lead portion 121, an intermediate-lead portion 122, and an inner-lead portion 123, wherein the outer-lead portion 121 has one end levelly linked to the supporting bar 101 and the other end vertically linked via the intermediate-lead portion 122 to the inner-lead portion 123, and the inner-lead portion 123 is substantially levelly arranged in relation to the down-set die pad 110 but unconnected to the die pad 110. The outer-lead portion 121 of each of the leads 120 is preferably plated with gold on the top surface thereof.

Figure 1C:
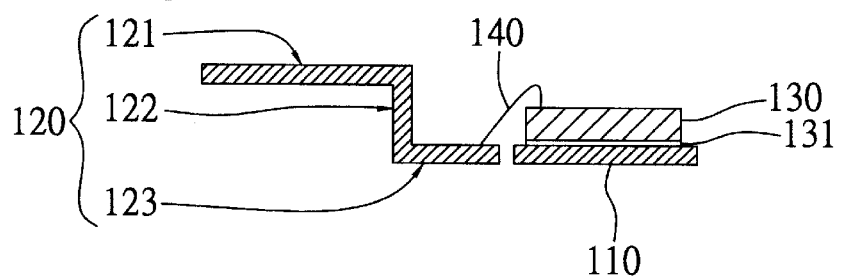

Referring next to FIG. 1C, during die-attachment process, a semiconductor chip 130 is adhered by means of an adhesive layer 131 on the die pad 110. It is to be noted that the height of the semiconductor chip 130 should be smaller than the downset depth of the die pad 110.

As the semiconductor chip 130 is mounted in position, a wire-bonding process is performed to bond a set of bonding wires 140, such as gold wires, for electrically coupling the semiconductor chip 130 to the inner-lead portion 123 of the leadframe 100.

Figure 1D:
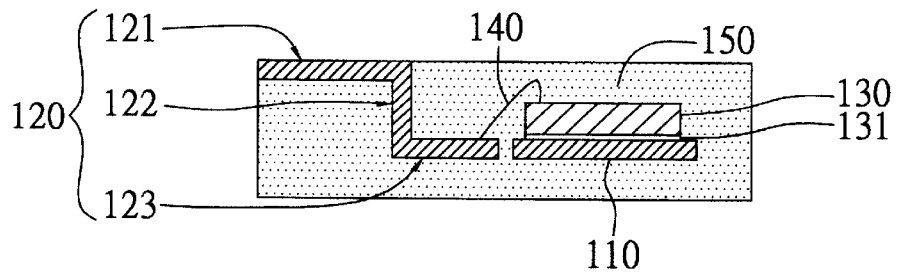

Referring further to FIG. 1D, in the next step, a molding process is performed to form a molded compound (or called an encapsulation body) 150 for encapsulating the semiconductor chip 130 as well as the bonding wires 140, the inner-lead portion 123, and the die pad 110, while exposing the upper surfaces of the outer-lead portions 121 of the leads 120 to the outside. During this molding process, the supporting bar 101 of the leadframe 100 is unencapsulated and exposed to the outside of the encapsulation body 150.

In the next step, a singulation process is performed to singulate the encapsulation body 150 from the supporting bar 101 to provide an individual package unit. This completes the fabrication of the semiconductor package according to the invention Second Preferred Embodiment (FIGS. 2A–2D)

The second preferred embodiment of the semiconductor package according to the invention is disclosed in full details in the following with reference to FIGS. 2A–2D.

Figure 2A:
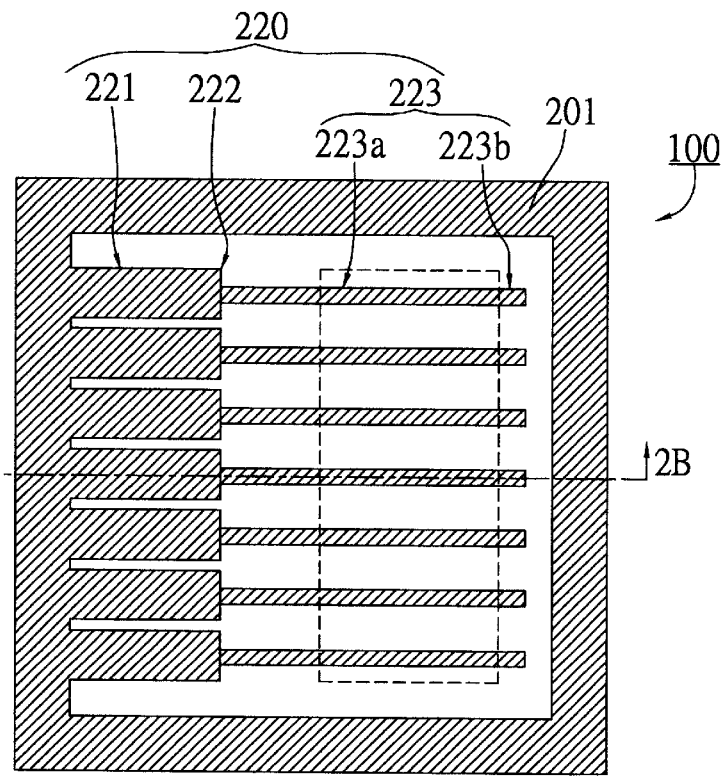
FIGS. 2A–2D are schematic diagrams used to depict a second preferred embodiment of the leadframe-based package according to the invention for MMC application.
Figure 2B:
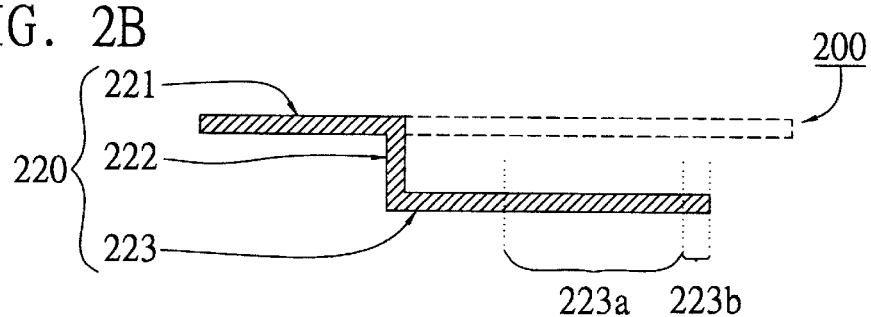

FIG. 2A is a schematic diagram showing the top view of a leadframe 200 utilized by the second preferred embodiment of the invention for constructing an MMC package; and FIG. 2B shows a sectional view of the leadframe 200 of FIG. 2A cutting through the line 2B–2B.

As shown, the second preferred embodiment differs from the previous one particularly in that the leadframe 200 utilized here has no die pad, which includes: (a) a supporting bar 201; and (b) a plurality of leads 220, each including an outer-lead portion 221, an intermediate-lead portion 222, and an elongated inner-lead portion 223; wherein the outer-lead portion 221 has one end levelly linked to the supporting bar 201 and the other end vertically linked via the intermediate-lead portion 222 to the inner-led portion 223; and the elongated inner-lead portion 223 is arranged at a downset position in relation to the supporting bar 201.

This second preferred embodiment differs from the previous embodiment particularly in that here the second preferred embodiment utilizes the elongated inner-lead portions 223 of the leads 220 as chip-supporting structure (rather than die pad utilized by the first preferred embodiment). To serve this purpose, the elongated inner-lead portions 223 of the leads 220 are each partitioned into a die-attachment section 223a (as the part enclosed by the dotted box shown FIG. 2A) and a wire-bonding section 223b.

Figure 2C:
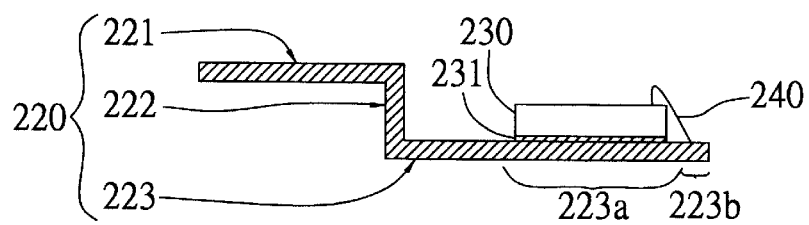
Figure 2D:
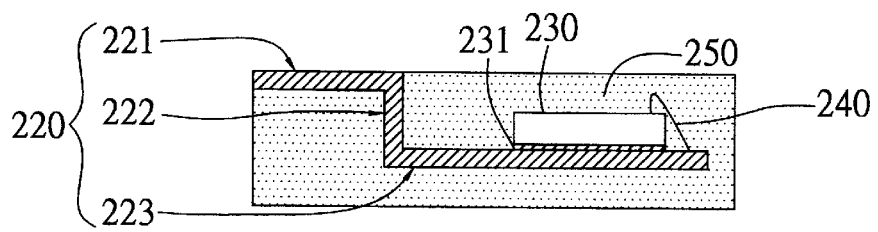

Referring next to FIG. 2C, during die-attachment process, a semiconductor chip 230 is adhered by means of an adhesive layer 231 on the die-attachment sections 223a of the inner-lead portions 223 of the leads 220.

As the semiconductor chip 230 is mounted in position, a wire-bonding process is performed to bond a set of bonding wires 240, such as gold wires, for electrically coupling the semiconductor chip 230 to the wire-bonding sections 223b, of the inner-lead portions 223 of the leads 220.

Referring further to FIG. 29, in the next step, a molding process is performed to form an encapsulation body 250 for encapsulating the semiconductor chip 230 as well as the bonding wires 240, and the inner-lead portion 23, while exposing the upper surfaces of the outer-lead portions 221 of the leads 220 to the outside.

In the next step, a singulation process is performed to singulate the encapsulation body 250 from the supporting bar 201 to provide an individual package unit. This completes the fabrication of the semiconductor package according to the invention.

Third Preferred Embodiment (FIGS. 3A–3D)

The third preferred embodiment of the semiconductor package according to the invention is disclosed in full details in the following with reference to FIGS. 3A–3D.

Figure 3A:
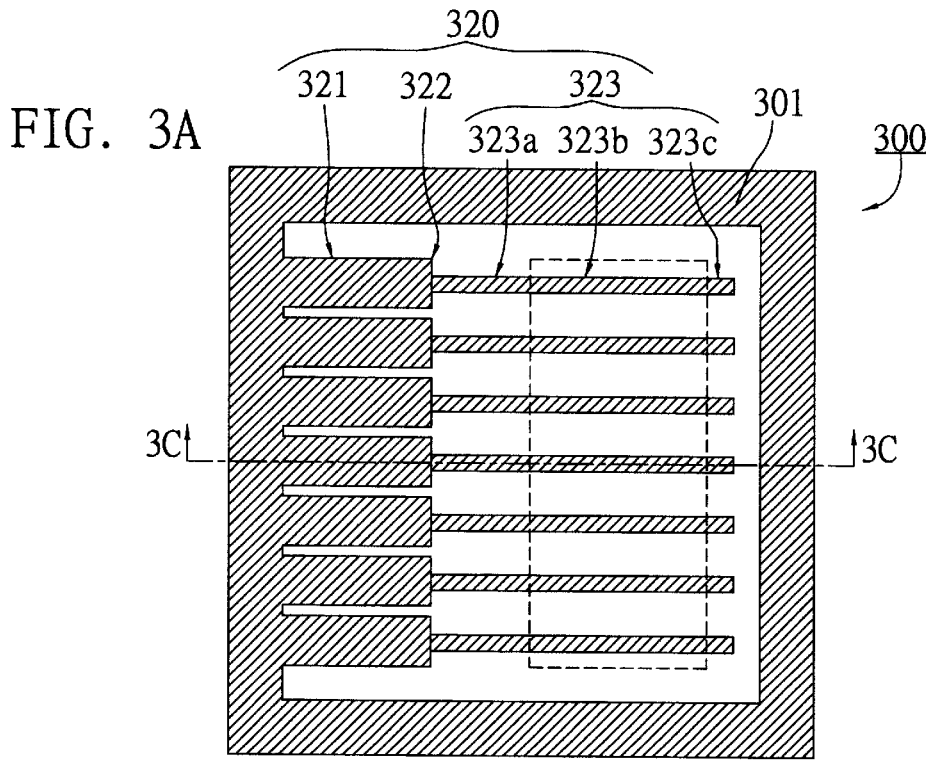
FIGS. 3A–3D are schematic diagrams used to depict a third preferred embodiment of the leadframe-based package according to the invention for MMC application.
Figure 3B:
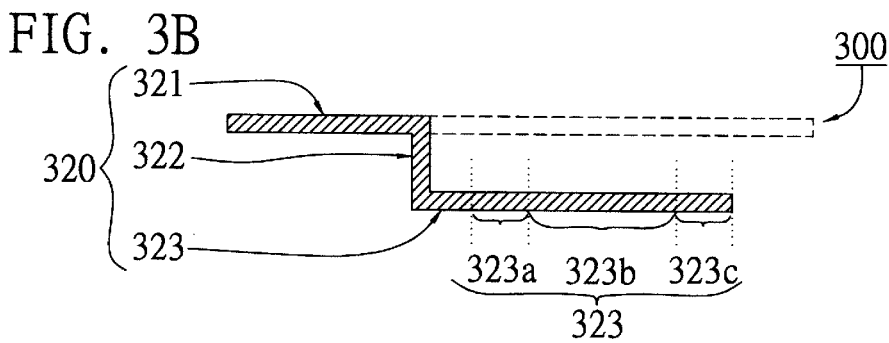
Figure 3C:
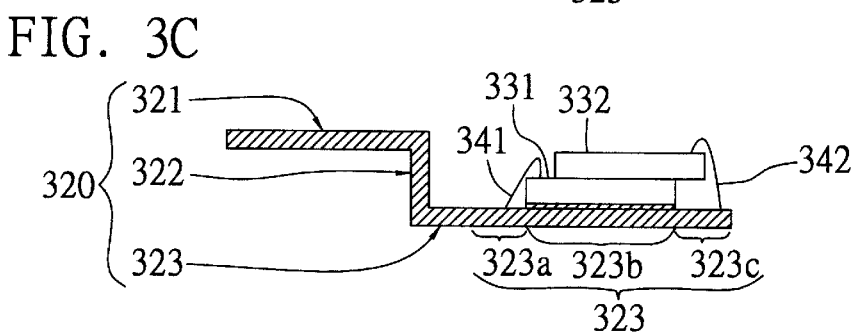

FIG. 3A is a schematic diagram showing the top view of a leadframe 300 utilized by the third preferred embodiment of the invention for constructing an MMC package; and FIG. 3B shows a sectional view of the leadframe 300 of FIG. 3A cutting through the line 3B–3B.

As shown, the leadframe 300 is also the type having no die pad, which includes: (a) a supporting bar 301; and (b) a plurality of leads 320, each including an outer-lead portion 321, an intermediate-lead portion 322, and an elongated inner-lead portion 323; wherein the outer-lead portion 321 has one end levelly linked to the supporting bar 301 and the other end vertically linked via the intermediate-lead portion 322 to the inner-lead portion 323; and the elongated inner-lead portion 323 is arranged at a downset position in relation to the supporting bar 301.

This third preferred embodiment differs from the second embodiment particularly in that here the third embodiment is designed for a dual-chip package, which also utilizes the elongated inner-lead portions 323 of the leads 320 as chip-supporting structure. To serve this purpose, the elongated inner-lead portions 323 of the leads 320 are each partitioned into a first wire-bonding section 323a, a die-attachment section 323b (as the part enclosed by the dotted box shown in FIG. 3A) and a second wire-bonding section 323c.

Referring next to FIG. 2C, during die-attachment process, a chipset including a first semiconductor chip 331 and a second semiconductor chip 332 are mounted in a stacked manner on the die-attachment sections 323b of the inner-lead portions 323 of the leads 320.

As the two semiconductor chips 331, 332 are mounted in position, a wire-bonding process is performed to bond a first set of bonding wires 341 and a second set of bonding wires 342; wherein the first set of bonding wires 341 are used for electrically coupling the first semiconductor chip 331 to the first wire-bonding sections 323a of the inner-lead portions 323 of the leads 320; while the second set of bonding wires 342 are used for electrically coupling the second semiconductor chip 332 to the second wire-bonding sections 323c of the inner-lead portions 323 of the leads 320.

Figure 3D:
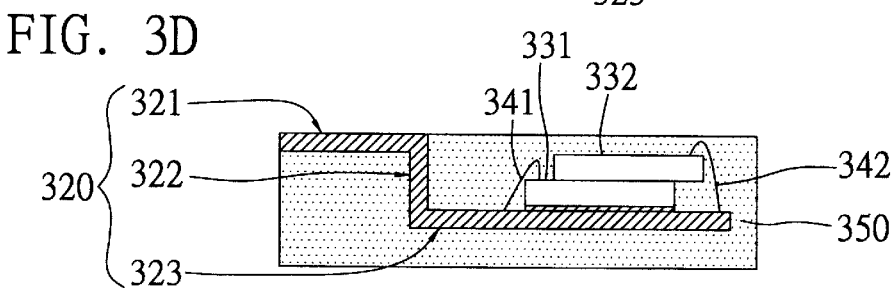

Referring further to FIG. 3D, in the next step, a molding process is performed to form an encapsulation body 350 for encapsulating the two stacked semiconductor chips 331, 332 as well as the bonding wires 341, 342, and the inner-lead portions 323 of the leads 320, while exposing the upper surfaces of the outer-lead portions 321 of the leads 320 to the outside.

In the next step, a singulation process is performed to singulate the encapsulation body 350 from the supporting bar 301 to provide an individual package unit. This completes the fabrication of the semiconductor package according to the invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, which comprises:
   (a) a lead frame, which includes:
      (a1) a supporting bar;
      (a2) a chip-supporting structure, which is arranged at a downset position in relation to the supporting bar; and
      (a3) a plurality of leads connected to one side of the supporting bar, each lead including an outer-lead portion and an inner-lead portion smaller in width than the outer-lead portion, making the outer-lead portions relatively more closely arranged than the inner-lead portions; wherein the outer-lead portion of each lead is levelly linked to the supporting bar, while the inner-lead portion is arranged beside the chip-supporting structure and linked to the outer-lead portion via an intermediate-lead portion;

(b) a chipset including at least one semiconductor chip mounted over the chip-supporting structure;

(c) a set of bonding wires for electrically coupling the semiconductor chip to the inner-lead portions of the leads; and (d) an encapsulation body for encapsulating the semiconductor chip, the chip-supporting structure, the bonding wires, and the inner-lead portions of the leads, while exposing one surface of the outer-lead portion of each of the leads to outside.

2. The semiconductor package of claim 1, where the chip-supporting structure is a die pad which is separated from the inner-lead portions of the leads and linked to the supporting bar via a plurality of tie bars.

3. The semiconductor package of claim 1, wherein the chip-supporting structure is an elongated part of the inner-lead portions of the leads.

4. The semiconductor package of claim 3, wherein the chipset includes a first semiconductor chip and a second semiconductor chip, which are mounted in a stacked manner over the elongated part of the inner-lead portions of the leads.

5. The semiconductor package of claim 1, wherein the chipset is an MMC chipset.

6. The semiconductor package of claim 1, wherein the outer-lead portions of the leads are gold-plated.

7. A semiconductor package, which comprises:

(a) a leadframe, which includes:
  (a1) a supporting bar; and
  (a2) a plurality of leads connected to one side of the supporting bar, each lead including an outer-lead portion and an inner-lead portion smaller in width than to outer-lead portion, making the outer-lead portions relatively more closely arranged than the inner-lead portions; wherein the outer-lead portion of each lead has one end levelly linked to the supporting bar and the other end linked to the inner-lead portion; while the inner-lead portion is arranged at a downset position in relation to the supporting bar and is partitioned into a die-attachment section and at least one wire-bonding section;

(b) a chipset including at least one semiconductor chip mounted over the die-attachment sections of the inner-lead portions of the leads;

(c) a set of bonding wires for electrically coupling the semiconductor chip to the wire-bonding sections of the leads; and (d) an encapsulation body for encapsulating the semiconductor chip, the bonding wires, and the inner-load portions of the leads, while exposing one surface of the outer-load portion of each of the leads to outside.

8. The semiconductor package of claim 7 wherein the chipset includes a first semiconductor chip and a second semiconductor chip, which are mounted in a stacked manner over the first wire-bonding sections of the inner-lead portions of the leads.

9. The semiconductor package of claim 7, wherein the chipset is an MMC chipset.

10. The semiconductor package of claim 7, wherein the outer-lead portions of the leads are gold-plated.

* * * * *